United States Patent [19]

Davis

[11] Patent Number: 4,724,397

[45] Date of Patent: Feb. 9, 1988

[54] TRIMMABLE DIFFERENTIAL AMPLIFIER HAVING A ZERO TEMPERATURE COEFFICIENT OFFSET VOLTAGE AND METHOD

[75] Inventor: William F. Davis, Tempe, Ariz.

[73] Assignee: Motorola, Inc., Schaumburg, Ill.

[21] Appl. No.: 880,391

[22] Filed: Jun. 30, 1986

[51] Int. Cl.$^4$ .............................................. H03F 3/45
[52] U.S. Cl. .................................... 330/256; 330/257
[58] Field of Search ................ 307/491, 494; 330/252, 330/256, 257, 289

[56] References Cited

PUBLICATIONS

Karlsson, L., "On a Temperature Stabilized Wideband Op Amp", *Nuclear Instruments & Methods* 96, 1971, pp. 387–395.

*Primary Examiner*—Eugene R. Laroche
*Assistant Examiner*—Steven J. Mottola
*Attorney, Agent, or Firm*—Michael D. Bingham

[57] ABSTRACT

A differential amplifier in which the offset voltage is adjustable and which has a zero temperature coefficient after being adjusted. The differential amplifier includes a pair of differentially connected transistors, a current mirror circuit coupled to the collectors of the pair of transistors for providing differential to single current conversion and a current source for supplying a thermal current to the interconnected emitters of the pair of transistors. The magnitude of the thermal current is proportional to absolute temperature and inversely proportional to a resistance of a given resistivity. Trimmable resistive elements are provided for adjusting any offset voltage appearing between the base electrodes of the pair of transistors to substantially zero volts with the adjusted offset voltage being temperature independent.

13 Claims, 2 Drawing Figures

TRIMMABLE DIFFERENTIAL AMPLIFIER HAVING A ZERO TEMPERATURE COEFFICIENT OFFSET VOLTAGE AND METHOD

CROSS REFERENCE TO A RELATED APPLICATION

The subject matter of this invention is related to the subject matter of U.S. Pat. No. 4,673,867, Entitled "Current Mirror Circuit And Method For Providing Zero Temperature Coefficient Trimmable Current Ratios" filed concurrently herewith and assigned to the assignee of the subject invention.

BACKGROUND OF THE INVENTION

This invention relates to differential amplifiers and, more particularly, to a bipolar differential amplifier integrated circuit and method for trimming the offset voltage thereof, the trimmed voltage of which is temperature independent.

Bipolar differential amplifier integrated circuits are well known. A typical trimmable bipolar differential amplifier includes a pair of transistors the emitters of which are differentially connected to a current source which provides a "tail" current to the transistors. The collectors of the two transistors may be coupled to a current mirror circuit which converts the differential input signal to a single-ended output signal as understood. The differential input signal is applied across the bases of the two transistors. The current mirror circuit may include resistive trimmable elements and is comprised of a diode coupled in series with collector of the first one of the pair of transistors and the first resistive element to ground reference potential and a third transistor whose base is connected to the collector of the first transistor and whose collector-emitter conduction path is coupled in series with the collector of the second transistor and second resistive element to the ground reference potential. U.S. Pat. No. 3,872,323 discloses a differential amplifier of the type discussed above.

Ideally, if all the elements of the differential amplifier are perfectly matched, a zero offset voltage is produced at the differential inputs, i.e., the bases of the two transistors as the differential amplifier is in a quiescent operating state. However, due to process tolerances in large volume production, there is almost always some mismatch of the elements. This mismatch produces a difference voltage across the bases of the two transistors as understood which is undesirable.

In the past the resistive elements have been trimmed using conventional trimming techniques to reduce the offset voltage to zero or as close to zero as possible.

A problem with most prior art differential amplifiers is that resistive trimming of the current mirror causes the semiconductor devices to be operated at different current densities. Therefore, although the offset voltage can be trimmed to zero volts at room temperature it has a temperature coefficient (TC) that is not zero. Hence, the offset voltage does not remain zero as the differential amplifier is operated over temperature.

Hence, a need exists for a differential amplifier and method for trimming the offset voltage thereof to substantially zero with the trimmed offset voltage being temperature independent.

SUMMARY OF THE INVENTION

Accordingly, it is an object of the present invention to provide an improved differential amplifier.

It is another object of the invention to provide a method of trimming the offset voltage of a differential amplifier to substantially zero such that the trimmed offset voltage is temperature independent.

Still another object of the invention is to provide a trimmable bipolar differential amplifier that is temperature independent of any trimmed element.

A further object of the invention is to provide a bipolar differential amplifier including a resistive trimmable current mirror circuit and a thermal current source.

In accordance with the above and other objects there is provided a trimmable differential amplifier comprised of a pair of transistors having their bases coupled respectively to inputs thereof to which a differential signal is supplied and emitters which may or may not be differentially coupled via emitter resistive elements to a common node, and a current supply coupled to the common node for providing a thermal current. A resistive trimmable current mirror circuit provides differential-to-single ended current conversion between the collectors of the two transistors and an output of the differential amplifier.

It is a feature of the invention that the value of the resistive elements may be individually trimmed to adjust any offset voltage with the adjusted offset voltage thereafter remaining temperature independent.

BREIF DESCRIPTION OF THE DRAWINGS

DETAILED DESCRIPTION OF THE PREFERRED EMBODIMENT

Figure 1:
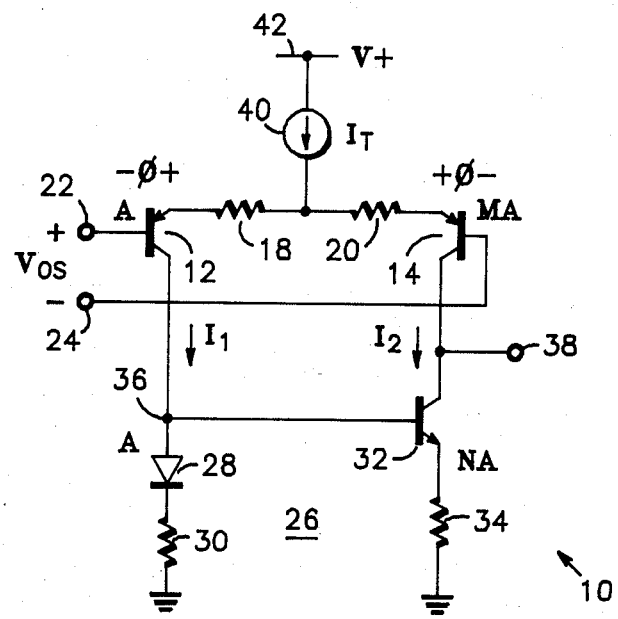
FIG. 1 is a schematic diagram of one embodiment of the present invention.

Turning now to FIG. 1 there is shown differential amplifier 10 of the present invention in which the offset voltage $V_{os}$ can be adjusted to substantially zero volts and in which the adjusted or trimmed value remains temperature independent. It is understood that differential amplifier 10 is suited to be manufactured in monolithic circuit form and in general has a structure that is well known to those skilled in the art. The basic difference between prior art differential amplifiers and differential amplifier 10 of the present invention will be made clear from the following description. Because the basic structure and operation of differential amplifier 10 is known (see for instance U.S. Pat. No. 3,872,323) only a brief explanation will be given.

Differential amplifier 10 comprises a pair of PNP transistors 12 and 14 the emitters of which are differentially coupled to circuit node 16 via resistors 18 and 20. The bases of transistors 12 and 14 are respectively coupled to the differential inputs 22 and 24 of differential amplifier 10 to which a differential input signal may be applied. The collectors of the two transistors are coupled to current mirror circuit 26 the latter of which provides differential-to-single ended signal conversion as understood. Current mirror circuit 26 includes semiconductor diode means 28, coupled between the collector of transistor 12 and ground reference potential via resistor 30, and NPN transistor 32. Transistor 32 has its collector-emitter conduction path coupled between the collector of transistor 14 and ground reference via resistor 34 and its base connected to the collector of transistor 12 at node 36. The output of differential amplifier 10 may be taken at output 38. Current source 40 provides a DC tail current $I_T$ to node 16 from power supply conductor 42.

Diode means 28, as is known, may be formed of a NPN transistor has its collector shorted to its base at node 36 and to the base of transistor 32. The emitter areas of transistor 32 and the transistor forming diode means 28 may be ratioed with respect to one another. For example, the area of the emitter of transistor 32 is shown as being N times the corresponding emitter area of diode means 28, where N is any positive number. Similarly, the emitter area of transistor 14 may be M times the emitter area of transistor 12, where M is any positive number. It is also understood that N and M could model the mismatch between the respective devices.

In operation, a differential input signal will produce differential related currents at the collectors of transistors 12 and 14. Current mirror circuit 26 provides a single output current at output 38 in response to the differentially related currents.

Ideally, with the bases of transistors 12 and 14 at equal potentials, tail current $I_T$ will be evenly split between the two transistors to produce equal currents I1 and I2. However, in reality, due to process tolerances, the elements of differential amplifier 10 are not perfectly matched. Currents I1 and I2 will not be equal and the offset voltage $V_{os}$ is produced across inputs 22 and 24 which is undesirable. This offset voltage which may, for example, have the polarity as shown can be trimmed to substantially zero volts by adjusting the resistive elements of the differential amplifier. Trimming in the prior art thus produces a substantially zero $V_{os}$ at some ambient temperature. However, the prior art suffers in that the temperature coefficient (TC) of the trimmed offset voltage is not zero and thus will vary with temperature. This results because trimming of the elements, for example the resistive elements of current mirror circuit 26, changes the relative current densities of transistor 32 with respect to diode means 28. Over temperature the current mirror circuit will therefore produce a TC in the two mirror currents I1 and I2 which, in turn, introduces a TC in $V_{os}$.

The present invention recognizes that by making tail current $I_T$ a thermal current, i.e., a current whose magnitude is proportional to absolute temperature T and inversely proportional to the resistance of a given resistivity, that any of the resistive elements or emitter areas of differential amplifier 10 may be trimmed or adjusted to adjust $V_{os}$ to zero volts and that the resulting trimmed $V_{os}$ will have a zero TC which is highly desirable. Therefore, differential amplifier 10 of the present invention has a trimmable offset voltage that once trimmed to a predetermined value will not substantially change with temperature, provided that $I_T$ is a thermal current of the form:

$$I_T = (kT/qR)\ln K_0 \tag{1}$$

where:
k is Boltzmann's constant
q is the charge of an electron
R is a resistance of given resistivity and TC; and
$K_0$ is a constant.

Current sources for providing the above described thermal current are well known.

The following illustrates mathematically the above stated results. It has been shown that if a resistive current mirror circuit is driven by a thermal current that the ratio of the current mirror currents I1/I2 is constant and temperature independent. The referenced patent application "Current Mirror Circuit And Method For Providing Zero Temperature Coefficient Trimmable Current Ratios" discloses such a current mirror and is incorporated herein by reference made thereto. Therefore, it has been shown that:

$$I1/I2 = K_1 \tag{2}$$

where $K_1$ is a constant independent of temperature. This ratio can be shown to be equal to:

$$I1/I2 = (1/M)eq(\phi 1 - \phi 2)/kT \tag{3}$$

where:
$\phi 1$ is the base-emitter voltage of transistor 12; and
$\phi 2$ is the base-emitter voltage of transistor 14.
Thus, $$\phi 1 - \phi 2 = (kT/q)\ln M(I1/I2) \tag{4}$$

$$= (kT/q)\ln MK_1 \tag{5}$$

solving now for $V_{os}$, $$V_{os} = \phi 1 + I1R1 - I2R2 - \phi 2 \tag{6}$$

$$= \phi 1 - \phi 2 + (K_1R1 - R2)I2 \tag{7}$$

where:
R1 is the resistance of resistor 18; and
R2 is the resistance of resistor 20, where the resistivity of resistors 18 and 20 is the same as resistance R.
Substituting equation 5 into equation 7 and rearranging:

$$V_{os} = (kT/q)\ln MK_1 + (K_1R1 - R2)I2 \tag{8}$$

Since $$I1 + I2 = I_T \tag{9}$$

and from equation 2:

$$K_1(I2) + I2 = I_T \tag{10}$$

thus $$I2 = I_T/(K_1 + 1) \tag{11}$$

Substituting equation 11 into equation 8 yields:

$$V_{os} = (kT/q)\ln MK_1 + (K_1R1 - R2)(I_T/(K_1 + 1)) \tag{12}$$

$$= (kT/q)\ln MK_1 + (K_1R1 - R2)(kT/q)\ln K_0/(K_1 + 1)R \tag{13}$$

Thus, $V_{os}$ equals:

$$kT/q[\ln MK_1 - (R2 - K_1R1)(\ln K_0)/(K_1 + 1)R] \tag{14}$$

or $$kT/q[\ln MK_1 - (R1/R)((R2/R1) - K_1)\ln K_0/(K_1+1)] \quad (15)$$

Since all of the terms of equation 15 enclosed within the brackets are constants, $$V_{os} = (kT/q) C \quad (16)$$

where C is a constant. If C is set to zero, which can be achieved for given values of $K_1$, M, R1, R2, R and $K_0$, $V_{os}$ can be set to zero independent of temperature. The ratio of I1 to I2, ($K_1$), can typically be adjusted by trimming resistors 30 and 34. Further, $K_1$ can be varied by different values of N. Thus, the term (ln $MK_1$) of equation 15 can be set equal to the term $(R1/R)((R2/R1) - K_1)\ln K_0/(K_1+1)$ thereby making C equal to zero. It is also understood that independently or in conjunction with adjusting $K_1$ resistors 18 and 20 (resistors R1 and R2 respectively) may be trimmed to also set C equal to zero.

Hence, by using a thermal tail current supply in conjunction with the trimmable resistive elements, $V_{os}$ of differential amplifier 10 can be trimmed to substantially zero volts and remains temperature independent.

Figure 2:
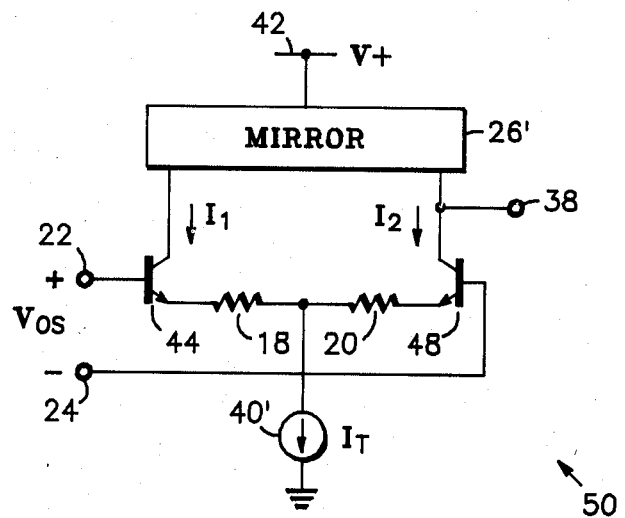
FIG. 2 is a schematic diagram of another embodiment of the present invention.

Turning to FIG. 2 there is illustrated differential amplifier 50 which is realized using complementary transistors with respect to differential amplifier 10. Components of differential amplifier 50 corresponding to like components of FIG. 1 are designated with the same reference numerals. Differential amplifier includes a pair of NPN transistors 44 and 48 differentially coupled together in the manner described above. The operation of differential amplifier 50 is substantially the same as described with regards to differential amplifier 10. It is understood that resistors 18 and 20 may or may not be included for differentially coupling the emitters of the transistors of differential amplifiers 10 and 50. Similarly, resistors 30 and 34 of the respective current mirrors may or may not be included. However, at least one set of trimmable resistors 18, 20 or 30, 34 must be utilized to provide the above described temperature independent offset voltage adjustment.

Hence, what has been described above is a novel differential amplifier in which the offset voltage is trimmable and remains temperature independent.

I claim:

1. A trimmable differential amplifier which is temperature independent of any trimmable element included therein, comprising:

first and second transistors the bases of which are coupled respectively to first and second imputs of the differential amplifier;

current supply means coupled to the emitters of said first and second transistors for providing thermal bias current flow through said transistors, said thermal bias current having the form of (kT/qR) ln K, where K is Boltzmann's constant, q is the charge of an electron, R is a resistance of given resistivity and temperature coefficient, T is absolute temperature and K is a constant;

current mirror means for converting differential related currents appearing at the collectors of said first and second transistors to a single output current, said current mirror means having first and second current paths with the currents flowing in said first and second current paths having a predetermined ratio; and trimmable resistive means having substantially the same temperature coefficient as R for adjusting any offset voltage occuring in the differential amplifier to substantially zero volts wherein said adjusted offset voltage is temperature independent.

2. The differential amplifier of claim 1 wherein said trimmable resistive means includes at least one trimmable resistor series coupled between the emitters of said first and second transistors, and said current supply means being connected at one end of said at least one additional trimmable resistor.

3. The differential amplifier of claim 2 wherein said trimmable resistive means includes at least one additional trimmable resistor for adjusting the ratio of said currents flowing in said first and second current paths of said current mirror means.

4. The differential amplifier of claim 3 wherein said trimmable resistive means includes a second additional trimmable resistor connected in series with said at least one trimmable resistor between said emitters of said first and second transistors with said current supply means being connected therebetween.

5. The differential amplifier of claim 4 wherein said trimmable resistive means includes a third additional trimmable resistor with said one additional and said third additional trimmable resistors being coupled respectively in said first and second current paths of said current mirror means.

6. The differential amplifier of claim 5 wherein said current mirror means includes:

a third transistor the collector-emitter conduction path being coupled in series between said collector of said first transistor and said third additional trimmable resistor in said second current path, the base of said third transistor being coupled to said collector of said second transistor; and diode means coupled in series between said collector of said second transistor and said one additional trimmable resistive means in said first current path.

7. The differential amplifier of claim 1 wherein said trimmable resistive means includes at least one trimmable resistor for adjusting the ratio of said currents flowing in said first and second current paths of said current mirror means.

8. The differential amplifier of claim 7 wherein said trimmable resistive means includes a second trimmable resistor with said one and said second trimmable resistors being coupled respectively in said first and second current paths of said current mirror means.

9. The differential amplifier of claim 8 wherein said current mirror means includes:

a third transistor the collector of which is connected to said collector of said first transistor, the emitter being connected to said one trimmable resistor in said first current path; and a fourth transistor the collector and base being connected both to said collector of said second transistor and the base of said third transistor, the emitter being connected to said second trimmable resistor in said second current path.

10. The differential amplifier of claim 9 wherein the emitter area of said third transistor is N times the emitter area of said fourth transistor where N is a positive number.

11. A differential amplifier, comprising:

first and second transistors the emitters of which are interconnected, the bases of which correspond to first and second inputs respectively;

current supply means for providing a thermal current, said thermal current flowing proportionally through said first and second transistors respectively, said thermal bias current having the form of $(kT/qR) \ln K$, where K is Boltzmanns's constant, q is the charge of an electron, R is a resistance of given resistivity and temperature coefficient, T is absolute temperature and K is a constant;

diode means coupled in a first current path in series with the collector of said first transistor through which a first portion of said thermal current flows;

a third transistor the base of which is connected to said collector of said first transistor and whose collector-emitter conduction path is coupled in series with the collector of said second transistor in a second current path through which a second portion of said thermal current flows;

trimmable resistive means having substantially the same temperature coefficient as R for adjusting any offset voltage appearing across the bases of said first and second transistors to substantially zero volts within said adjusted offset voltage being temperature independent; and means for connecting the collector of said second transistor to an output.

12. The differential amplifier of claim 11 wherein said trimmable resistive means includes first and second trimmable resistors connected in series between said emitters of said first and second transistors, said current supply means being connected at the interconnection of said first and second trimmable resistors.

13. The differential amplifier of claim 12 wherein said trimmable resistive means includes third and fourth trimmable resistors, said third trimmable resistor being connected in said first current path and said fourth trimmable resistor being connected in said second current path.

* * * * *

UNITED STATES PATENT AND TRADEMARK OFFICE
CERTIFICATE OF CORRECTION

PATENT NO. : 4,724,397
DATED : February 9, 1988
INVENTOR(S) : William F. Davis

It is certified that error appears in the above-identified patent and that said Letters Patent is hereby corrected as shown below:

Column 5, claim 1, line 52, delete "imputs" insert --inputs--.

Signed and Sealed this

Fifth Day of December, 1989

*Attest:*

JEFFREY M. SAMUELS

*Attesting Officer*   *Acting Commissioner of Patents and Trademarks*